(12) United States Patent
Lin et al.

(10) Patent No.: US 8,937,995 B2
(45) Date of Patent: Jan. 20, 2015

(54) EQUALIZER AND EQUALIZING METHOD THEREOF

(75) Inventors: Hou-Wei Lin, Taipei (TW); Yi-Lin Li, Kao-Hsiung (TW); Cheng-Yi Huang, I-Lan Hsien (TW); Kuang-Yu Yen, Tai-Chung (TW)

(73) Assignee: RealTek Semiconductor Corp., Hsinchu (TW)

( * ) Notice: Subject to any disclaimer, the term of this patent is extended or adjusted under 35 U.S.C. 154(b) by 1078 days.

(21) Appl. No.: 11/555,691

(22) Filed: Nov. 2, 2006

(65) Prior Publication Data

US 2007/0104265 A1    May 10, 2007

(30) Foreign Application Priority Data

Nov. 4, 2005 (TW) .............................. 94138779 A

(51) Int. Cl.
*H03H 7/30* (2006.01)
(52) U.S. Cl.
USPC ........................................................ 375/233
(58) Field of Classification Search
USPC ................. 375/233, 350, 265, 341, 232, 346; 714/794; 348/614; 370/206; 708/322, 708/323
See application file for complete search history.

(56) References Cited

U.S. PATENT DOCUMENTS

| | | | | |
|---|---|---|---|---|
| 5,687,162 A * | 11/1997 | Yoshida et al. | ................ | 370/203 |
| 5,729,526 A * | 3/1998 | Yoshida | ........................ | 370/206 |
| 6,178,209 B1 * | 1/2001 | Hulyalkar et al. | ............ | 375/341 |
| 7,257,181 B2 * | 8/2007 | Jones et al. | .................... | 375/350 |
| 7,418,034 B2 * | 8/2008 | Xia et al. | ....................... | 375/233 |
| 2002/0154248 A1 * | 10/2002 | Wittig et al. | ................... | 348/614 |
| 2005/0138534 A1 * | 6/2005 | Nakajima et al. | ............. | 714/794 |
| 2005/0271135 A1 * | 12/2005 | Shida | ............................. | 375/232 |
| 2006/0120475 A1 * | 6/2006 | Zhidkov et al. | ............... | 375/265 |
| 2007/0064845 A1 * | 3/2007 | Phanse et al. | ................. | 375/348 |
| 2007/0263715 A1 * | 11/2007 | Kim et al. | ..................... | 375/233 |

OTHER PUBLICATIONS

Chevillat et al. "Decoding of Trellis-Encoded Signals in the Presence of Intersymbol Interference and Noise"; IEEE Transcations on Communications; vol. 37, No. 7; Jul. 1989; pp. 669-676.*
Wikipedia, Viterbi decoder; pp. 1-5; http://en.wikipedia.org/wiki/Viterbi_decoder.*
J. Hagenauer and P. Hoeher, "A Viterbi Algorithm with Soft-Decision Outputs and its Applications", IEEE Globecom, pp. 1680-1686, 1989.

(Continued)

*Primary Examiner* — Young T. Tse
(74) *Attorney, Agent, or Firm* — McClure, Qualey & Rodack, LLP

(57) ABSTRACT

An equalizer and an equalizing method for equalizing a received signal, where the received signal includes at least one primary interference and a plurality of secondary interferences. The Viterbi equalizer includes a filter module for filtering out the secondary interferences from the received signal to generate a filtered signal, a serial to parallel converter, coupled to the filter module, for generating a plurality of sequences according to the filtered signal, and a Viterbi equalizing module, coupled to the serial to parallel converter, for respectively equalizing the plurality of sequences to generate a plurality of equalized sequences. The architecture of the Viterbi equalizing module is greatly simplified thereby reducing the calculation activity of the Viterbi equalizer as well as maintaining its efficiency.

16 Claims, 3 Drawing Sheets

(56) References Cited

OTHER PUBLICATIONS

G. Ungerboeck, "Channel Coding with Multilevel/Phase Signals", IEEE Trans. Inform. Theory, vol. IT-28, No. 1, pp. 55-67, Jan. 1982.

A. Duel-Hallen and C. Heegard, "Delayed Decision-Feedback Sequence Estimation", IEEE Trans. Commun., vol. COM-37, No. 5, pp. 428-436, May 1989.

G.D. Forney, Jr., "Maximum-Likelihood Sequence Estimatioin of Digital Sequences in the Presence of Intersymbol Interference", IEEE Trans. Inform. Theory, vol. IT-18, No. 3, pp. 363-378, May 1972.

Eyuboğlu, M.V. and Qureshi, S.U.H, "Reduced-State Sequence Estimation with Set Partitioning and Decision Feedback", IEEE Trans. Commun., vol. 36, Issue 1, pp. 13-20, Jan. 1988.

A.J. Viterbi and J.K. Omura, Principles of Digital Communication and Coding. Tokyo: McGraw-Hill Kogakusha, Ltd., pp. 227-287, pp. 348-379, 1979.

* cited by examiner

EQUALIZER AND EQUALIZING METHOD THEREOF

BACKGROUND OF THE INVENTION

1. Field of the Invention

The present invention relates to an equalizer, and more particularly, to a Viterbi equalizer.

2. Description of the Prior Art

In information systems, inter-symbol interference (ISI) is a common phenomenon. The primary cause of ISI is multipath propagation. For example, when a transmission end transmits a symbol D(1), the symbol D(1) may pass through different paths before arriving at a receiving end. Since the symbol D(1) passing through the different paths corresponds to different delayed times, the receiving end may detect energy of the symbol D(1) at different times. Hence, when the transmission end transmits sequentially, for example, a plurality of symbols D(2), D(3), D(4)... to the receiving end, the symbols can be affected by the previously transmitted symbol D(1).

To further explain the multipath propagation phenomenon, please refer to FIG. 1. FIG. 1 illustrates a diagram of an equivalent model of a multipath channel. As shown in FIG. 1, the model 10 includes a plurality of delay units 12, 14, a plurality of multipliers 22, 24, 26, and an adder 28. If the symbol transmitted by the transmission end is represented as D(k), and through a tapped delay line model of the multipath channel with coefficients a0, a1, ..., an, then a signal R(k) detected by the receiving end can be represented in the formula listed below:

$$R(k) = \sum_{i=0}^{n} D(k-i) * ai \qquad \text{Formula (1)}$$

According to Formula (1), if the coefficients a0, a1, a2, of the tapped delay line module are 1, 0.2, −0.4 respectively, and the remaining coefficients are all zeros, then the influence of symbols D(k−1), D(k−2) on the received signal R(k) constitutes ISI. Because the ratio of the symbols D(k), D(k−1), D(k−2) affecting the received signal R(k) is 1:0.2:−0.4, the multipath channel of the above-mentioned can be represented as a tapped delay line module with coefficients of [1 0.2 −0.4]. When the length of the tapped delay line module becomes longer (i.e., there are more non-zero coefficients), the ISI caused by a certain transmission symbol will last longer.

Equalizers emerged to solve the ISI problem. There are two types of most commonly seen equalizers. The first type of equalizer is the decision feedback equalizer. Please refer to FIG. 2. FIG. 2 illustrates a functional block diagram of a decision feedback equalizer 30. The decision feedback equalizer 30 includes a subtracter 32, a decision unit 34, and a feedback filter 60. The feedback filter 60 is utilized for generating a reconstructed interference signal SI. Then the subtracter 32 subtracts the reconstructed interference signal SI from a received signal SR to generate a calculation signal SR'. Lastly, the decision unit 34 generates a decision signal SD according to the value of the calculation signal SR'. At this point, the decision output, or the decision signal SD, is outputted as an equalized signal generated by the decision feedback equalizer 30. As the equalized signal approaches the received signal without multipath propagation, the equalizer is proved of better efficiency.

The feedback filter 60 generating the reconstructed interference signal SI includes a plurality of delay units 62, 64, 66, 68, a plurality of multipliers 72, 74, 76, 78, and an adder 82. The coefficients $b_0, b_1, b_2, \ldots b_m$ with the multipliers 78, 76, 74, 72 can be pre-determined through techniques such as channel estimation or adaptive filtering. Please note that, in an effort to simplify the calculation process in the following examples, the coefficient b0 is set to 1. Furthermore, the coefficients $b_0, b_1, b_2, \ldots, b_m$ are calculated to approach the coefficients $a_0, a_1, \ldots, a_n$ as illustrated in FIG. 1 of the tapped delay line module of the environmental multipath channel. Thus, to provide a more detailed explanation, please assume that $b_k$ is equal to $a_k$ for k=0~n and $b_k$ is 0 for k≥n+1. Hence, the feedback filter 60 can utilize the plurality of decision signals SD previously generated and the coefficients $b_0, b_1, b_2, \ldots b_m$, to calculate a reconstructed interference signal SI(K), i.e., the ISI of the received signal SR(k). The calculation of the feedback filter 60 can be represented by the formula listed below:

$$S_I(k) = \sum_{i=1}^{m} S_D(k-i) * bi \qquad \text{Formula (2)}$$

The decision feedback equalizer 30 described earlier does suffer from disadvantages. Particularly, the decision feedback equalizer 30 eliminates all the interferences in the received signal, but in practice, retaining a portion of the interference allows the received signal to retain more energy, and said energy can help the receiving end to perform a more accurate determination such that a more accurate received signal can be obtained. It is well known that the decision feedback equalizer 30 cannot eliminate interference sensibly, therefore, there exists room for improvement regarding its application.

The second type of equalizer is the Viterbi equalizer. The primary mechanism of the Viterbi equalizer is to generate a trellis tree according to the multipath channel. The trellis tree can have many states. A maximum likelihood algorithm is utilized within a predetermined period of time for identifying which state is the most likely path for the received signal. Then, an equalized signal is generated according to the path selected (i.e., the most likely path), and becomes the equalizing result of the received signal within the predetermined period of time. Operation and realization of the Viterbi equalizer can be referenced from many sources, including: G. D. Forney, Jr. "Maximum-Likelihood Sequence Estimation of Digital Sequences in the Presence of Intersymbol Interference" IEEE Transactions on Information Theory, Vol. IT-18, No. 3 pp. 363-378 May 1972, A. J. Viterbi and J. K. Omura (1979) "Principles of Digital Communication and Coding" McGraw-Hill Kogakusha Ltd, Tokyo, G. Ungerboeck "Channel Coding with Multilevel/Phase Signals" IEEE Transactions on Information Theory, Vol. IT-28, No. 1, pp. 56-67, January 1982, A. Duel-Hallen and C. Heegard "Delayed Decision-Feedback Sequence Estimation" IEEE Transactions on Telecommunications, Vol. COM-37, No. 5, pp. 48-436, May 1989, A. Duel-Hallen and C. Heegard "Reduced-State Sequence Estimation with Set Partition and Decision Feedback" IEEE Transactions on Telecommunications, Vol. 52, No. 9, pp. 1541-1562, November 1973, J. Hagenauer and P. Hoeher "A Viterbi Algorithm with Soft-Decision Output and its Application" IEEE Globecom, pp. 1680-1686, 1989. Please note that there are numerous implementations for the Viterbi equalizer, and the above-listed merely serve as examples.

The architecture of the trellis tree of the Viterbi equalizer corresponds to all possible ISI combinations [D(k−1) D(k−2) ... D(k−N)] of the multipath channel, such as:

[D(k−1)], [D(k−2)], [D(k−1) D(k−3)], or [D(k−1) D(k−2) D(k−3)], etc. The state count of the trellis tree and the length of the tapped delay line module demonstrate an exponential relationship; in other words, when the length of the tapped delay line module is P, and all symbol count is M, the state count of the trellis tree is $M^P$. As a result, when the delay spread of the multipath channel becomes more severe, the length of the tapped delay line module increases accordingly, which translates to a drastic ramp in the complexity of the trellis tree. Consequently, the amount of calculation of the Viterbi equalizer increases significantly.

In general, the Viterbi equalizer seeks a sequence from all of the possible sequences generated that most resembles the received signal in generating an equalizing result. Although the conventional Viterbi equalizer can make a full use of the energy of the received signal, and at the same time, maintain a more satisfactory anti-ISI effect than others, the amount of calculation of the conventional Viterbi equalizer exhibits an exponential growth in response to an increase in the length of the tapped delay line module, or the worsening of the delay spread of the multipath channel.

SUMMARY OF THE INVENTION

Therefore it is one of the objectives of the present invention to provide a Viterbi equalizer and equalizing method thereof, which can significantly reduce the amount of calculation of the Viterbi equalizer while maintaining efficiency.

The claimed invention discloses an equalizer for equalizing a received signal. The received signal comprises at least one primary interference and a plurality of secondary interferences. The equalizer comprises a filter module for filtering out the plurality of the secondary interferences for generating a filtered signal, a serial to parallel converter coupled to the filter module for generating a plurality of sequences according to the filtered signal, and a Viterbi equalizing module coupled to the serial to parallel converter for respectively equalizing the plurality of sequences to generate a plurality of equalized sequences.

The claimed invention further discloses an equalizing method for equalizing a received signal. The received signal comprises at least one primary interference and a plurality of secondary interferences. The equalizing method comprises filtering out the plurality of secondary interferences from the received signal to generate a filtered signal, providing a serial to parallel converter for outputting a plurality of sequences according to the filtered signal, and respectively equalizing the plurality of sequences for generating a plurality of equalized sequences.

The claimed invention further discloses an equalizer for eliminating inter-symbol interference of a received signal. The received signal comprises a plurality of interference components contributed by a plurality of symbols. The equalizer comprises a filter module for eliminating at least a portion of the plurality of the interference components from the received signal and generating a transitional signal, and a Viterbi equalizing module coupled to the filter module for performing a Viterbi equalizing process on the transitional signal after eliminating the portion of the interference components and generating an output signal.

These and other objectives of the present invention will no doubt become obvious to those of ordinary skill in the art after reading the following detailed description of the preferred embodiment that is illustrated in the various figures and drawings.

DETAILED DESCRIPTION

Certain terms are used throughout the following description and claims to refer to particular system components. As one skilled in the art will appreciate, consumer electronic equipment manufacturers may refer to a component by different names. This document does not intend to distinguish between components that differ in name but not function. In the following discussion and in the claims, the terms "including" and "comprising" are used in an open-ended fashion, and thus should be interpreted to mean "including, but not limited to . . . " The terms "couple" and "couples" are intended to mean either an indirect or a direct electrical connection. Thus, if a first device couples to a second device, that connection may be through a direct electrical connection, or through an indirect electrical connection via other devices and connections.

Figure 3:
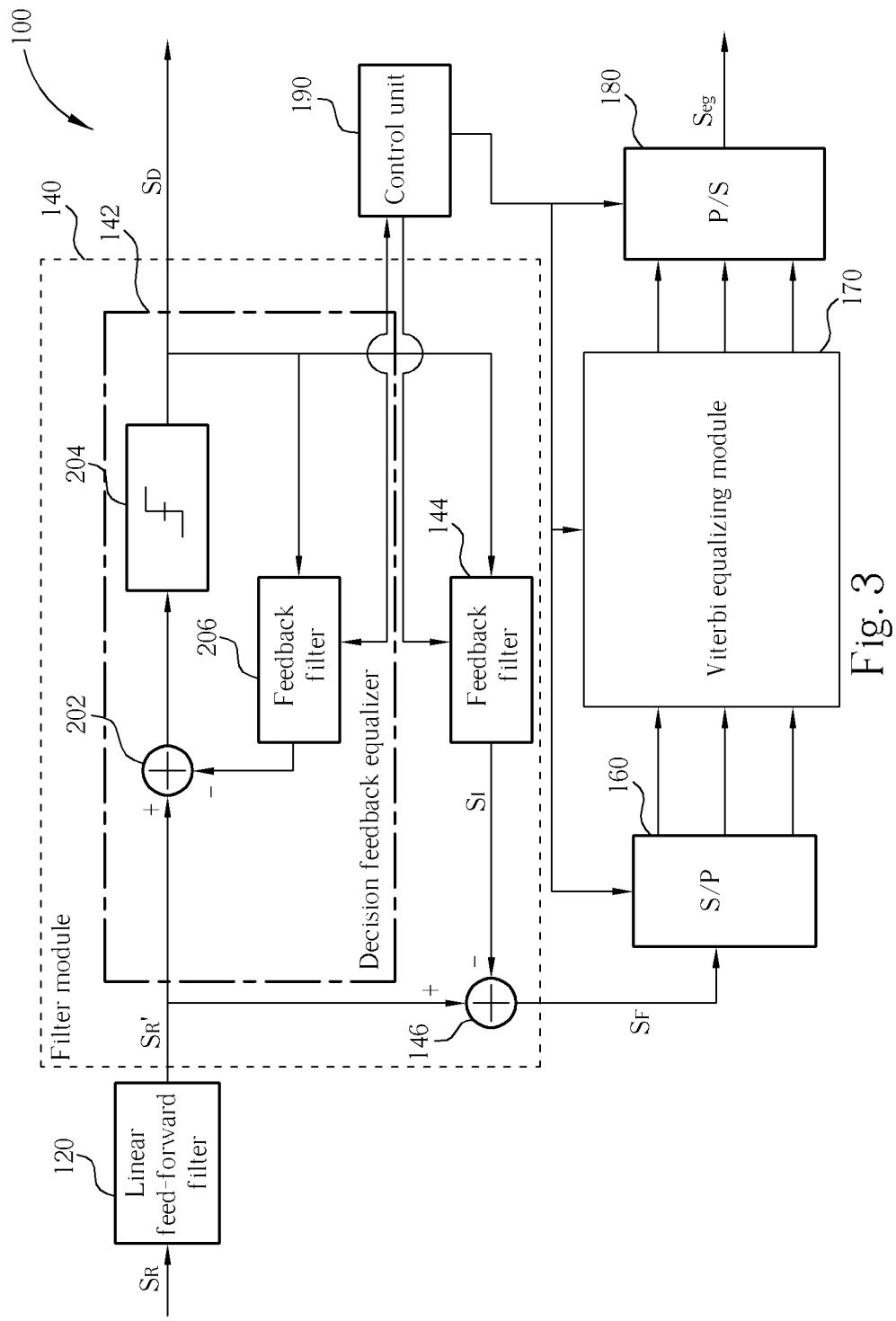
FIG. 3 illustrates a functional block diagram of a Viterbi equalizer according to an embodiment of the present invention.

To further explain the present invention equalizer 100, please refer to FIG. 3. FIG. 3 illustrates a functional block diagram of an equalizer 100 according to an embodiment of the present invention. In this embodiment, the equalizer 100 includes a linear feed-forward filter (FFF) 120, a filter module 140, a serial to parallel converter (S/P) 160, a Viterbi equalizing module 170, a parallel to serial converter (P/S) 180, and a control unit 190. After a received signal SR is inputted to the FFF 120, the FFF 120 performs filtering on the received signal $S_R$ for generating a filtered signal SR'. Next, the FFF 120 transmits the filtered signal SR' to the filter module 140. Because the operation and architecture of the FFF 120 is well known to those of ordinary skill in the art, therefore, it will not be detailed herein for the sake of brevity.

The signal SR' outputted by the FFF 120 includes the interference signals caused by the multipath channel, wherein the interference signal having the greatest influence on the signal SR' is termed as the primary interference, and other interference signals are termed as the secondary interference. The primary function of the filter module 140 is to filter out the plurality of secondary interferences, so as to generate a filtered signal $S_F$. Therefore, the signal $S_R'$ and the filtered signal $S_F$ can be represented in the formula listed below:

$$S'_R(k) = D(k) + \sum_{i=1}^{m} ai \cdot D(k-i), m \geq n \quad \text{Formula (3)}$$

$$S_F(k) = D(k) + an \cdot D(k-n), an = \max\{ai \mid 1 \leq i \leq m\} \quad \text{Formula (4)}$$

As is shown in Formula (4), an×D(k−n) is the primary interference of the signal SR' and the filtered signal SF(k) can only be affected, or interfered, by the transmitted symbol D(k−n) corresponding to the filtered signal SF(k−n). Similarly, the transmitted symbol D(k) corresponding to the filtered signal SF(k) can only cause interference to the filtered signal SF(k+n).

Next, the S/P 160 performs sampling on the filtered signal SF for generating a plurality of sampling values SF(1), SF(2), . . . , SF(4n), and then the plurality of sampling values are transmitted to the Viterbi equalizing module 170. Although the above-mentioned parallel output mechanism of FIG. 3 illustrates 3 parallel output sequences (n=3), the mechanism can expand to n parallel output sequences, wherein the first sequence is SF(1),SF(1+n), SF(1+2n), SF(1+3n), . . . ; the second sequence is SF(2), SF(2+n), SF(2+2n), SF(2+3n),. . .; the n-th sequence is SF(n), SF(2n), SF(3n), SF(4n), . . . . Please note that in each sequence of each parallel output in the operation of the filter module previously mentioned, a sampling value SF(k) can only cause interference to a next sampling value SF(k+n) in the same sequence, and other sampling values belonging to other sequences are not affected thereby. Therefore, each sequence can be viewed as an independent set of signals, and the tapped delay line module [1 bn] can be used to represent 151 in each sequence. In comparison to the tapped delay line module [1 $b_1$ $b_2$ . $b_m$] corresponding to the signal SR', the 151 phenomenon of the sequence outputted by the S/P 160 is greatly simplified.

After the filter module 140 eliminates the plurality of secondary interferences of the signal SR', the Viterbi equalizing module 170 further equalizes the n sequences received and eliminates, or filters out, the primary interference, and the Viterbi equalizing module 170 then generates n corresponding equalized sequences. Please note that the equalizing technique of the Viterbi equalizing module 170 can be of any architecture used for Viterbi equalizer well known to those having ordinary skill in the art, and will not be detailed herein for the sake of brevity. In practice, the Viterbi equalizing module 170 can include n sets of Viterbi equalizing module circuits corresponding to the n sequences, or the Viterbi equalizing module 170 can utilize hardware of less than n sets (e.g., such as one set), and cooperate with sufficient data buffering space in a time-division multiplexing fashion.

Importantly, after the filtered signal SF is split into n sequences by the S/P 160, when the Viterbi equalizing module 170 processes each sequence, the corresponding length of the tapped delay line module is only 1/m of a conventional Viterbi equalizer. Because the circuit complexity of the Viterbi equalizing module 170 and the length of the tapped delay line module have an exponential relationship, hence the above-mentioned embodiment reducing the length of the tapped delay line module achieves the objective of significantly simplifying the architecture of the Viterbi equalizing module 170. Lastly, the P/S 180 receives the plurality of equalized sequences transmitted from the Viterbi equalizing module 170 and generates an equalized signal Seq by sequentially re-arranging the equalized sequences. The equalized signal Seq is the equalized result of the received signal SR.

Figure 1:
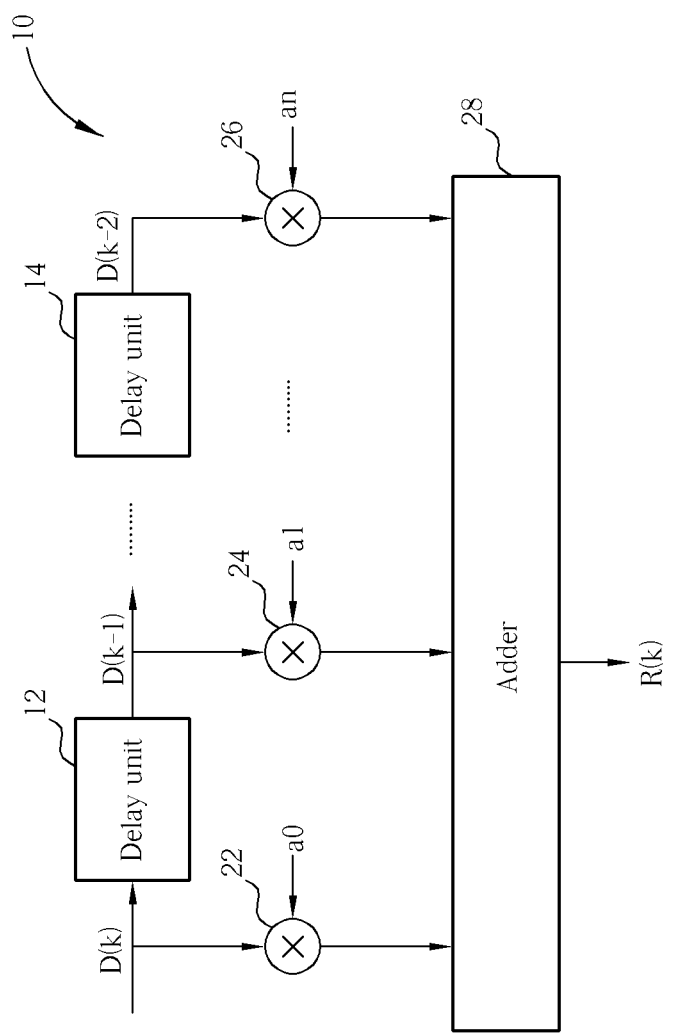
FIG. 1 illustrates a diagram of an equivalent model of a multipath channel.
Figure 2:
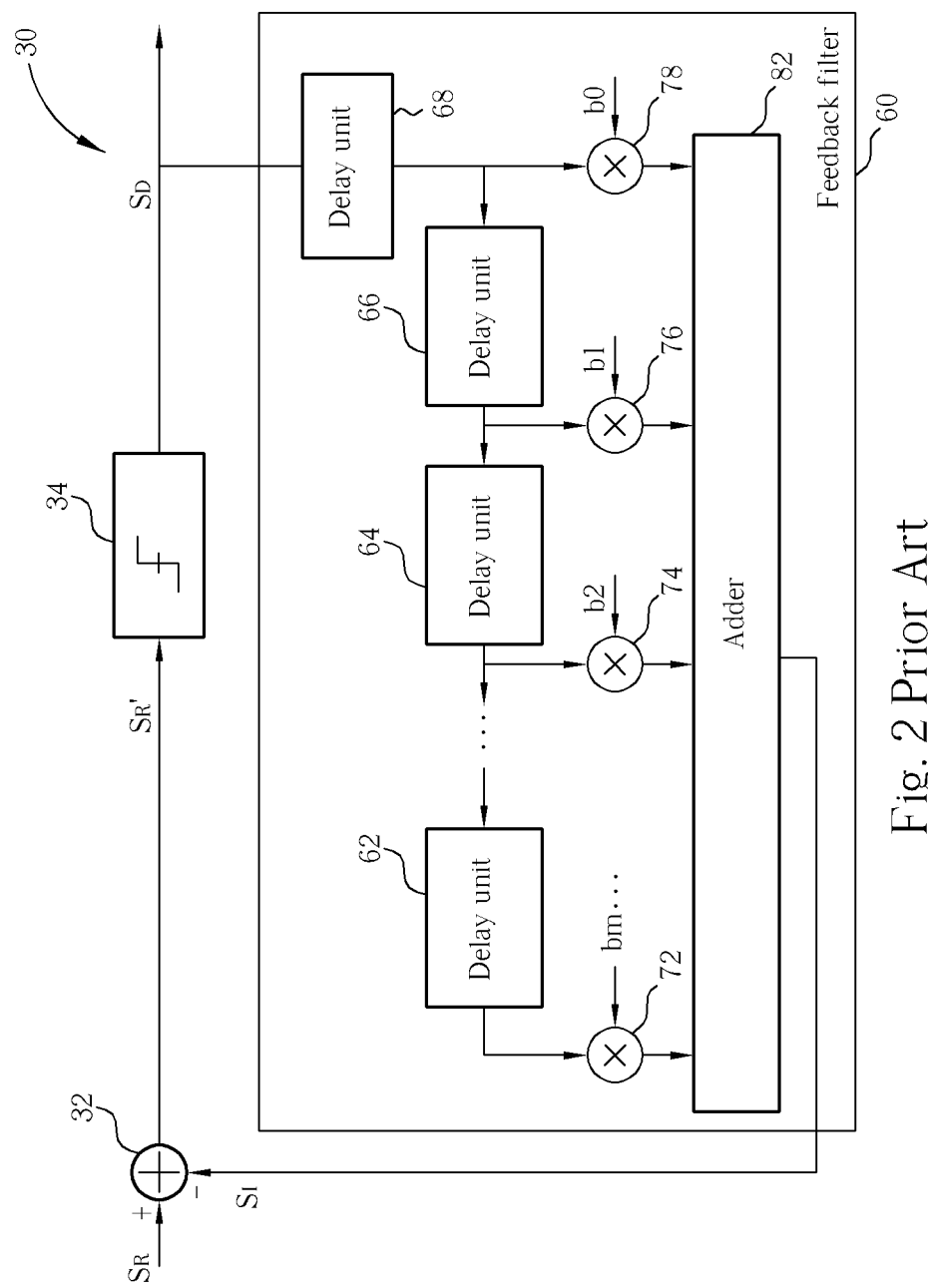
FIG. 2 illustrates a functional block diagram of a decision feedback equalizer.

Operations and a detailed architecture of the filter module 140 will be explained in the following. In this embodiment, the filter module 140 includes a decision feedback equalizer 142, a feedback filter 144, and a subtracter 146. The decision feedback equalizer 142 further includes a subtracter 202, a decision unit 204, and a feedback filter 206. Since the architecture and operation of the decision feedback equalizer 142 can be chosen similar to the equalizer of FIG. 2, and thus is well known to those of ordinary skill in the art, they will not be reiterated herein for the sake of brevity.

Please note that both the feedback filter 144 and the feedback filter 206 of the present embodiment are FIR filters, and the operation thereof are similar with the exception of the coefficient adopted. For example, if the plurality of coefficients used by the feedback filter 206 are [0 0.2 −0.4 0.1], then the coefficient among them with the greatest absolute value is "−0.4". Therefore the coefficient −0.4 is the primary interference, and the other non-zero coefficients become the secondary interferences. The reconstructed interference signal SI outputted by the feedback filter 144 includes only the component of the plurality of secondary interferences because it is desired that the filtered signal SF maintains the primary interference component. Therefore, the coefficient used by the feedback filter 144 that corresponds to the primary interference is set to zero, and other coefficients are set the same as those used by the feedback filter 206; that is, the plurality of coefficients used by the feedback filter 144 are [0 0.2 0 0.1]. Next, the subtracter 146 subtracts the reconstructed interference signal SI from the received signal SR for generating the filtered signal SF.

Furthermore, the control unit 190 is utilized for allocating a suitable coefficient to the feedback filter 144 according to the coefficient used by the feedback filter 206. The control unit 190 also determines whether to enable the feedback filter 144, the subtracter 146, the S/P 160, the Viterbi equalizing module 170, and the P/S 180. When the above-mentioned components are enabled, the equalized signal Seq outputted by the Viterbi equalizing module 170 becomes the output result of the equalizer 100; however, when the multipath propagation phenomenon is not obvious, the control unit 190 can choose not to enable the above-mentioned components, and at this time the decision signal SD outputted by the decision feedback equalizer 142 becomes an equalized result of the received signal SR.

The number of sequences outputted by the S/P 160 is not limited to the above-mentioned embodiment. If the filtered signal SF corresponds to P sampling values, and P is divisible by an integer Q, then Q can be assigned as the number of the output sequences of the S/P 160. Furthermore, as P sampling values of the filtered signal SF are converted to Q sequences, the Viterbi equalizing module achieves two functions: it eliminates the interference signal that is Q samples apart from the desired signal; it also eliminates all the interference signals that are Q*i samples apart from the desired signal, with i being any integer number. It is further to be noted that the number of the primary interference is not limited to 1. A person of ordinary skill in the art will be able to appreciate that upon understanding the teaching of the present invention, it becomes apparent that the Viterbi equalizer in the embodiment can be designed to accommodate more than one primary interference, though preferably equally spaced in time.

The above-mentioned equalizer 100 includes a filter module for filtering out the plurality of secondary interferences of the received signal and retaining a primary interference to generate a filtered signal. The equalizer 100 further includes the S/P to convert a string of filtered signal into a plurality of shorter sequences, and the plurality of sequences are passed to the Viterbi equalizing module for generating a plurality of equalized sequences. Lastly, the plurality of equalized sequences are combined to form an equalized signal. Because the ISI phenomenon of the above-mentioned sequences is less complicated, the architecture of the Viterbi equalizing module is greatly simplified thereby reducing amount of the calculation of the Viterbi equalizing module.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. An equalizer comprising:
   a feed forward filter configured to receive a signal and generate a first filtered signal; and
   a filter module configured to receive the first filtered signal and generate a second filtered signal, the filter module comprising:
      a decision feedback equalizer comprising a feedback loop includes a first subtractor configured to receive the first filtered signal, a decision unit coupled to the first subtractor and configured to output a decision signal, and a first feedback filter coupled to the first subtractor and the decision unit, the first feedback filter configured to receive the decision signal, adopt respective coefficients corresponding to plural interference signals, and provide a first filtered output based on the adopted coefficients to the first subtractor;

a second subtractor configured to receive the first filtered signal; and a second feedback filter configured to receive the decision signal from the decision unit, and set to a first value, a coefficient, corresponding to a primary interference signal of the plural interference signals, that is a different value in the first feedback filter, and provide a second filtered output having a reconstructed interference signal comprising plural secondary interference signals of the plural interference signals to the second subtractor, the second subtractor further configured to provide the second filtered signal based on the first filtered signal and the reconstructed interference signal, the second filtered signal comprising the primary interference signal.

2. The equalizer of claim 1 further comprising:

a serial to parallel converter configured to receive the second filtered signal from the second subtractor, perform sampling on the second filtered signal and generate a plurality of sequences;

an equalizing module configured to receive the plurality of sequences from the serial to parallel converter and respectively equalize the plurality of sequences to generate a plurality of equalized sequences, the equalized sequences are generated based in part on the primary interference signal; and a parallel to serial converter coupled to the equalizing module, configured to combine the plurality of equalized sequences and generate an equalized signal to be an output signal of the equalizer.

3. The equalizer of claim 2 wherein if the primary interference signal of a first received signal corresponds to a second received signal, and the second received signal was received n symbols prior to the first received signal, the equalizing module comprises n Viterbi equalizers, and the serial to parallel converter outputs n sequences to the equalizing module, where n is an integer number greater than 1.

4. The equalizer of claim 2 wherein the serial to parallel converter generates the plurality of sequences according to a plurality of sampling values of the second filtered signal.

5. The equalizer of claim 2 wherein the equalizing module comprises a Viterbi equalizer.

6. The equalizer of claim 1 wherein the filter module is further configured to filter out the plural secondary interference signals, wherein the second feedback filter is further configured to adopt the respective coefficients corresponding to the plural interference signals used by the first feedback filter except for the coefficient set to the first value, and wherein the coefficient of the first feedback filter is set to a second value.

7. The equalizer of claim 6 wherein the first value is zero, and wherein the primary interference signal has a greater influence on the first filtered signal than each of the plural secondary interference signals.

8. The equalizer of claim 1 wherein the first feedback filter, the second feedback filter, or a combination of the first and second feedback filters comprise a respective finite impulse response (FIR) filter.

9. An equalizing method comprising:

receiving a signal and generating a first filtered signal; and at a filter module comprising a decision feedback equalizer, the decision feedback filter comprising a first subtractor, a decision unit coupled to the first subtractor, and a first feedback filter coupled to the first subtractor and the decision unit, receiving the first filtered signal and generating a second filtered signal, the generating comprising:

receiving at the first subtractor the first filtered signal;

providing from the decision unit a decision signal based on an output of the first subtractor;

receiving at the first feedback filter the decision signal;

adopting, by the first feedback filter, respective coefficients corresponding to plural interference signals;

providing by the first feedback filter a first filtered output based on the adopted coefficients to the first subtractor;

receiving at a second subtractor of the filter module the first filtered signal;

receiving at a second feedback filter of the filter module the decision signal from the decision unit;

setting to a first value, a coefficient, corresponding to a primary interference signal of the plural interference signals that is a second value in the first feedback filter;

providing by the second feedback filter a second filtered output having a reconstructed interference signal comprising plural secondary interference signals of the plural interference signals to the second subtractor; and providing, by the second subtractor, the second filtered signal based on the first filtered signal and the reconstructed interference signal, the second filtered signal comprising the primary interference signal.

10. The equalizing method of claim 9 further comprising:

providing a serial to parallel converter to perform sampling on the second filtered signal and generating a plurality of sequences according to the second filtered signal;

equalizing each of the plurality of sequences using Viterbi equalization to generate a plurality of equalized sequences, the equalizing being based in part on the primary interference signal; and providing a parallel to serial converter to combine the plurality of equalized sequences and to generate an equalized signal to be an output signal of the equalizing method.

11. The equalizing method of claim 10 wherein if the primary interference signal of a first received signal corresponds to a second received signal, and the second received signal was received n symbols prior to the first received signal, the serial to parallel converter outputs n sequences, where n is an integer number greater than 1.

12. The equalizing method of claim 10 wherein the step of generating the plurality of sequences comprises:

sampling the second filtered signal to generate a plurality of sampling values; and outputting the plurality of sampling values in parallel to generate the plurality of sequences.

13. The equalizing method of claim 9 further comprising filtering out the plural secondary interference signals based on the subtraction between the first filtered signal and the reconstructed interference signal.

14. The equalizing method of claim 13 further comprising adopting, at the second feedback filter, the respective coefficients corresponding to the plural interference signals used by the first feedback filter except for the coefficient set to the first value.

15. The equalizing method of claim 14 wherein the first value is zero, and wherein the primary interference signal has a greater influence on the first filtered signal than each of the plural secondary interference signals.

16. An equalizer comprising:
   a feed forward filter configured to receive a signal and generate a first filtered signal, the first filtered signal comprising plural interference signals caused by a multipath channel, the plural interference signals including a primary interference signal and plural secondary interference signals, the primary interference signal having a greatest influence on the first filtered signal; and
   a filter module configured to receive the first filtered signal and generate a second filtered signal, the second filtered signal comprising the primary interference signal, the filter module comprising:
      a decision feedback equalizer comprising a feedback loop includes a first subtractor configured to receive the first filtered signal, a decision unit coupled to the first subtractor and configured to output a decision signal, and a first feedback filter coupled to the first subtractor and the decision unit, the first feedback filter configured to receive the decision signal, adopt respective coefficients corresponding to the plural interference signals, and provide a first filtered output based on the adopted coefficients to the first subtractor;
      a second subtractor configured to receive the first filtered signal; and
      a second feedback filter configured to receive the decision signal from the decision unit, adopt the coefficients used by the first feedback filter except for zeroing a coefficient corresponding to the primary interference signal that was nonzero in the first feedback filter, and provide a second filtered output having a reconstructed interference signal comprising the plural secondary interference signals to the second subtractor, the second subtractor further configured to provide the second filtered signal based on the first filtered signal and the reconstructed interference signal, the second filtered signal comprising the primary interference signal.

\* \* \* \* \*